US012241151B2

(12) United States Patent
Utada et al.

(10) Patent No.: US 12,241,151 B2
(45) Date of Patent: Mar. 4, 2025

(54) METHOD FOR MANUFACTURING A PART MADE OF A MONOCRYSTALLINE SUPERALLOY

(71) Applicants: Safran Aircraft Engines, Paris (FR); CENTRE NATIONAL DE LA RECHERCHE SCIENTIFIQUE (CNRS), Paris (FR); ECOLE NATIONALE SUPERIEURE DE MECANIQUE ET D'AEROTECHNIQUE DE POITIERS, Chasseneuil du Poitou (FR); UNIVERSITE DE POITIERS, Poitiers (FR)

(72) Inventors: Satoshi Utada, Moissy-Cramayel (FR); Joël Delautre, Moissy-Cramayel (FR); Sarah Hamadi, Moissy-Cramayel (FR); Jonathan Cormier, Chasseneuil du Poitou (FR); Patrick Villechaise, Vouneuil sous Biard (FR); Jérémy Rame, Moissy-Cramayel (FR)

(73) Assignees: SAFRAN AIRCRAFT ENGINES, Paris (FR); CENTRE NATIONAL DE LA RECHERCHE SCIENTIFIQUE (CNRS), Paris (FR); ECOLE NATIONALE SUPERIEURE DE MECANIQUE ET D'AEROTECHNIQUE DE POITIERS, Chasseneuil du Poitou (FR); UNIVERSITE DE POITIERS, Poitiers (FR)

( * ) Notice: Subject to any disclaimer, the term of this patent is extended or adjusted under 35 U.S.C. 154(b) by 494 days.

(21) Appl. No.: 17/622,963

(22) PCT Filed: Jun. 26, 2020

(86) PCT No.: PCT/EP2020/068115
§ 371 (c)(1),
(2) Date: Dec. 27, 2021

(87) PCT Pub. No.: WO2020/260645
PCT Pub. Date: Dec. 30, 2020

(65) Prior Publication Data
US 2022/0243312 A1 Aug. 4, 2022

(30) Foreign Application Priority Data
Jun. 28, 2019 (FR) ...................................... 1907174

(51) Int. Cl.
*C22F 1/10* (2006.01)
*C22C 19/05* (2006.01)

(52) U.S. Cl.
CPC .............. *C22F 1/10* (2013.01); *C22C 19/057* (2013.01)

(58) Field of Classification Search
CPC ... C22F 1/10; C22C 19/057; C21D 1/78; C21D 9/0068; C30B 29/52
See application file for complete search history.

(56) References Cited

U.S. PATENT DOCUMENTS

| | | |
|---|---|---|
| 2003/0047252 A1 | 3/2003 | Caron et al. |
| 2008/0240926 A1 | 10/2008 | Kobayashi et al. |
| 2013/0142637 A1* | 6/2013 | Harris ................... C22C 19/057 420/443 |
| 2021/0246533 A1 | 8/2021 | Rame et al. |

FOREIGN PATENT DOCUMENTS

| | | |
|---|---|---|
| EP | 0 063 511 A1 | 10/1982 |
| EP | 1 211 336 A1 | 6/2002 |
| EP | 1 398 393 A1 | 3/2004 |
| JP | 6-293945 A | 10/1994 |
| WO | WO 2019/097162 A1 | 5/2019 |

OTHER PUBLICATIONS

US 4,923,525 A, 05/1990, Khan et al. (withdrawn)
International Search Report, issued in PCT/EP2020/068115, dated Oct. 8, 2020.
Written Opinion of the International Searching Authority, issued in PCT/EP2020/068115, dated Oct. 8, 2020.

* cited by examiner

*Primary Examiner* — Jessee R Roe
(74) *Attorney, Agent, or Firm* — BIRCH, STEWART, KOLASCH & BIRCH, LLP

(57) ABSTRACT

The invention concerns a method for manufacturing an aircraft part, the part comprising a monocrystalline nickel-based superalloy substrate, the method consecutively implementing the steps of moulding the part at a moulding temperature greater than the melting temperature of the superalloy, and cooling the part, such that the monocrystalline superalloy has a γ phase and a γ phase, solution heat treatment of the part at a first temperature between the solves temperature of the γ' phase and the melting temperature of the superalloy, homogenising the crystalline structure or the part, cooling the part to ambient temperature, first tempering and second tempering.

14 Claims, 4 Drawing Sheets

[Fig. 1]
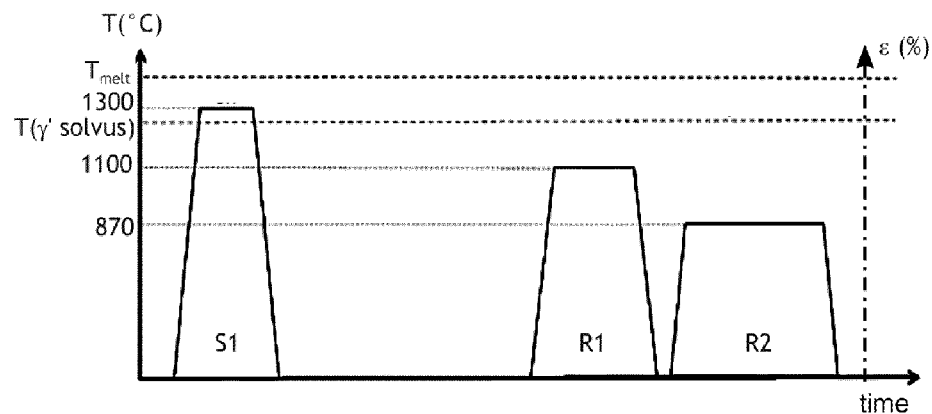
[Fig. 2]
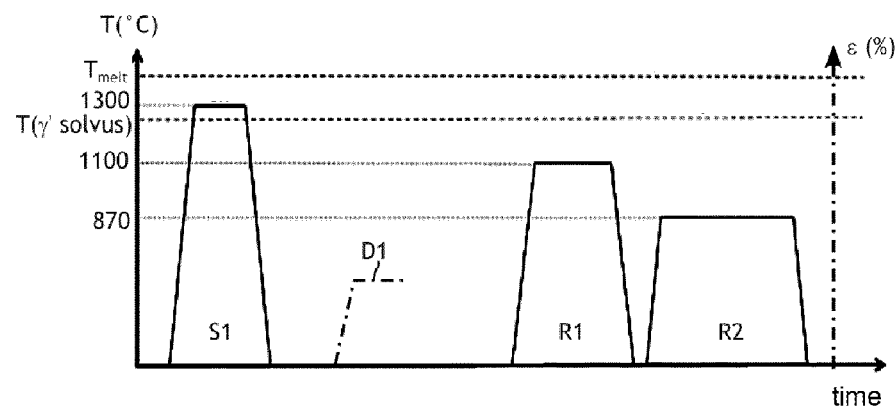
[Fig. 3]
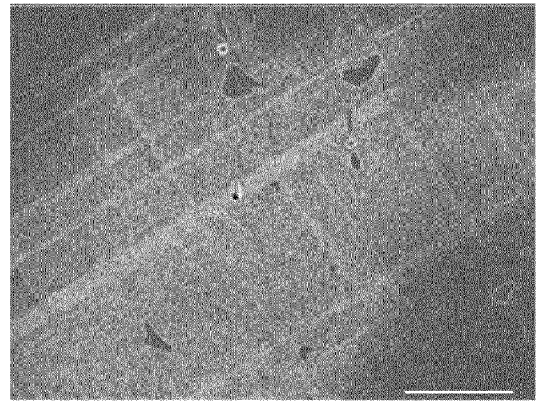

[Fig. 4]
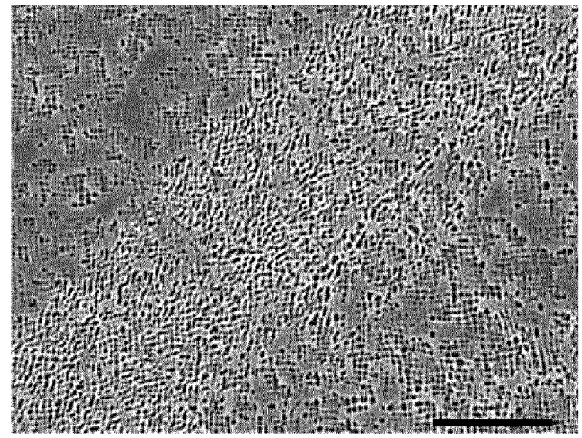
[Fig. 5]
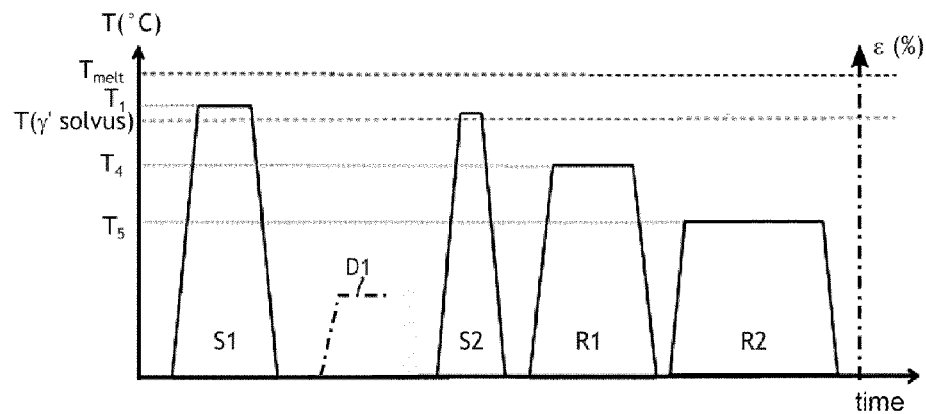
[Fig. 6]
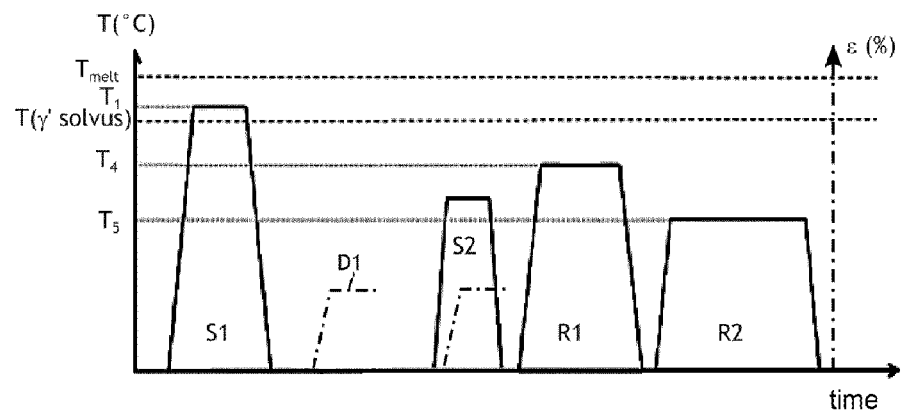

[Fig. 7]
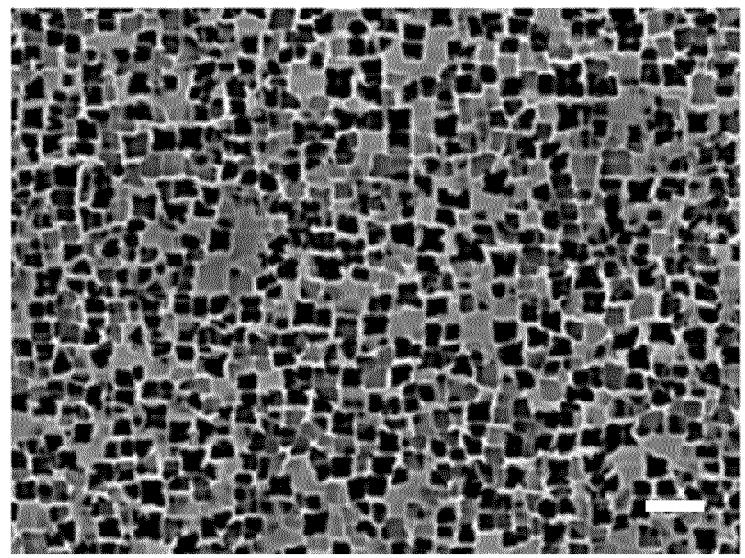
[Fig. 8]
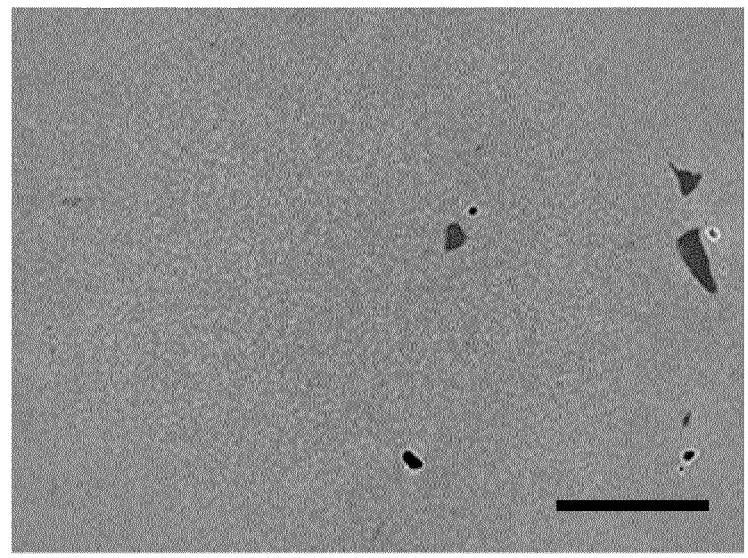

[Fig. 9]
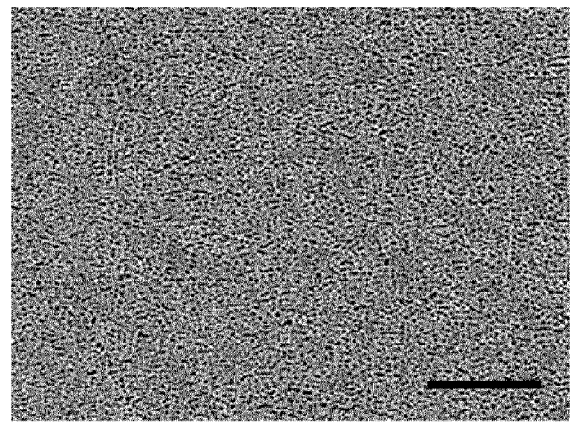
[Fig. 10]
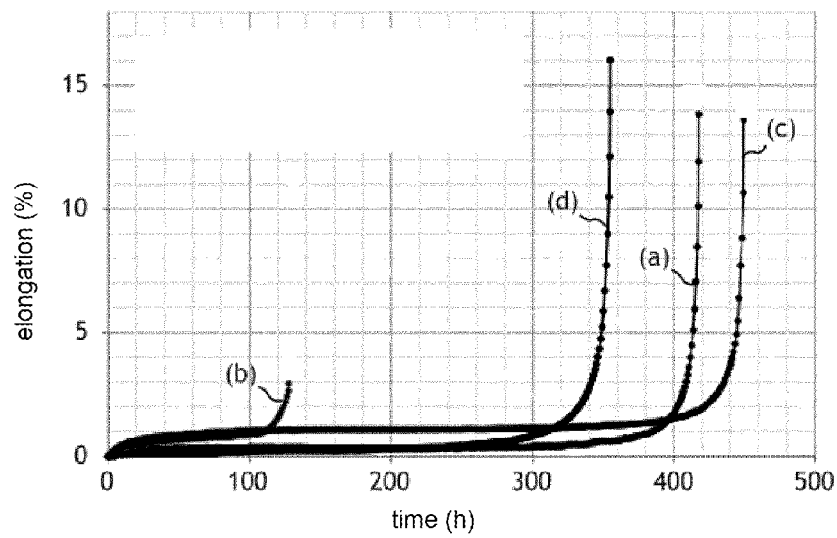

METHOD FOR MANUFACTURING A PART MADE OF A MONOCRYSTALLINE SUPERALLOY

FIELD OF THE INVENTION

The present invention concerns an aircraft part, such as a turbine blade or a distributor fin, as well as a method for manufacturing such a part.

STATE OF THE ART

It is desirable to reduce the fuel consumption of aircraft turbomachines. For this purpose, it is known that it is necessary to increase the gas temperature of the fuel burned in the turbomachine and reduce the quantity of air used for cooling a turbine of the turbomachine. However, creep resistance of the materials used for the manufacture of the turbine parts decreases above high temperatures, for example above 900° C.

Materials made of monocrystalline nickel-based superalloy have mechanical properties allowing them to resist creep at high temperature, for example above 900° C., and a particularly high resistance to oxidation relative to other metal alloys. Thus, monocrystalline superalloy is used for the manufacture of many turbomachine parts, such as turbine blades.

The manufacture of monocrystalline superalloy parts comprises, in a known manner, a step of casting the part, during which the superalloy in liquid form is poured into a ceramic mould, formed beforehand by molten wax.

The microstructure of the as-cast alloy has numerous chemical heterogeneities. Indeed, the alloy solidifies not by flat growth but by dendritic growth. Thus the core, the various layers of dendrites and the interdendritic areas do not have the same chemical composition, because their solidification occurs successively. Moreover, when the alloy solidifies, the $\gamma'$ forming elements (for example, Al, Ta and Ti) segregate in the liquid metal differently from W or Mo, which have a substantial concentration in the core of the dendrites. These inhomogeneities reduce the creep resistance of the superalloy.

In this regard, it is known to heat treat the part so as to allow diffusion of the elements of the superalloy and thus homogenize their concentration in the part. This treatment is commonly called solution heat treatment. The solution heat treatment can be either partial, i.e., subsolvus, for example by treating the part at a temperature 50° C. below the solvus temperature of the superalloy. The solution heat treatment may also be complete, supersolvus, for example by treating the part at a temperature close to the solvus of the $\gamma'$, for example 50° C. greater than the solvus temperature of the $\gamma'$.

In reference to FIG. 1 and FIG. 2, in the case of superalloy AM1, the temperature of the solution heat treatment S1 is comprised between the solvus and the solidus, for example at 1300° C. At this temperature, the eutectic clusters dissolve, allowing better distribution of the $\gamma'$ phase, while remaining below the melting point of the alloy. However, the size, distribution and morphology of the $\gamma'$ phase precipitates do not allow optimizing the creep resistance of the part.

In this regard, it is known to thermally treat the part following the solution heat treatment S1. The heat treatment (s) are commonly called aging or tempering heat treatments. In the case of superalloy AM1, the part is treated after solution heat treatment by a first tempering R1 at 1100° C. for five hours. This treatment makes it possible to optimize the size, morphology and distribution of $\gamma'$ precipitates. The part is treated after first tempering R1 by a second tempering R2, at 870°, for 16 hours. The second tempering R2 makes it possible to increase the volume fraction of the $\gamma'$ phase of the superalloy.

After the solution heat treatment S1, the first tempering R1 and the second tempering R2, superalloy AM1 comprises cubic $\gamma'$ precipitates distributed homogeneously and aligned.

In reference to FIG. 2, the monocrystalline superalloy part can undergo deformation during manufacture, in particular a plastic deformation D1 at low temperature. Such a deformation can be caused, for example, by the action of the casting mould on the part during demoulding, by a local concentration of mechanical stresses during the cooling process of the part due to a local cooling rate gradient, by assembling the part to another module, or by an unexpected shock when handling the part. In particular, if the part has a geometric defect caused by removing the part from the casting mould, a plastic deformation is intentionally applied onto the part so as to correct it.

The plastic deformation D1 applied to the part causes a defect in the microstructure of the part. If the part is placed in a high temperature atmosphere after the plastic deformation D1, for example greater than 900° C., the defect can cause a change of the crystalline structure of the part. This recrystallization can cause a reduction in the service life of the part under working conditions.

FIG. 3 and FIG. 4 are photomicrographs illustrating the structure of a superalloy after undergoing a plastic deformation D1. Bands showing the evolution of the microstructure caused by the plastic deformation D1 are visible. The scale of FIG. 3 corresponds to a length of 100 µm. The scale of FIG. 4 corresponds to a length of 10 µm.

DISCLOSURE OF THE INVENTION

One goal of the invention is to propose a solution to prevent recrystallization of a nickel-based superalloy part following a plastic deformation undergone by the part.

This goal is attained in the context of the present invention by means of a manufacturing method for an aircraft part, the part comprising a monocrystalline nickel-based superalloy substrate, the method successively implementing the following steps:
  moulding the part at a moulding temperature greater than the melting temperature of the superalloy and cooling the part, so that the monocrystalline superalloy has a $\gamma$ phase and a $\gamma'$ phase,
  solution heat treatment of the part at a first temperature $T_1$ comprised between the solvus temperature of the $\gamma'$ phase and the melting temperature of the superalloy,
  cooling the part, for example to room temperature,
  homogenization of the crystalline structure of the part,
  cooling the part, for example to room temperature,
  first tempering and second tempering.

Since the homogenization treatment of the crystalline structure is implemented between the moment at which a plastic deformation can be applied to the part and between the first tempering, the deformation can be distributed homogeneously throughout the part before the first tempering. Thus, recrystallization can be avoided during the tempering treatments.

The invention is advantageously supplemented by the following characteristics, taken individually or in any one of the technically-possible combinations thereof:
  the superalloy is predominantly composed of nickel and has a mass fraction of chromium comprised between 7% and 9%, of cobalt comprised between 5.5% and 7.5%, of aluminium comprised between 4% and 6%, of titanium comprised between 1% and 2%, of tantalum comprised between 7% and 9%, of molybdenum comprised between 1% and 3% and of tungsten comprised between 4.5% and 6.5%, the superalloy also comprising carbon and zirconium, the superalloy is predominantly composed of nickel and preferentially has a mass fraction of chromium comprised between 2.5% and 4.5%, of cobalt comprised between 9% and 11%, of aluminium comprised between 4.5% and 6.5%, of titanium comprised between 0.5% and 1%, of tantalum comprised between 7% and 9%, of molybdenum comprised between 0.3% and 1%, of tungsten comprised between 5% and 7%, and of rhenium comprised between 4% and 5.5%.

the homogenization of the crystalline structure of the part is implemented by a heat treatment of the part at a second temperature $T_2$ greater than the solvus temperature of the γ' phase and strictly less than the first temperature $T_1$, the homogenization is implemented by the heat treatment of the part at a second temperature $T_2$ for at least 10 minutes, especially for 20 minutes, and preferentially for one hour, the second temperature $T_2$ is strictly comprised between 1280° C. and 1350° C., especially between 1280° C. and 1300° C. and preferentially between 1285° C. and 1295° C., the moulding step is followed by a demoulding step, and the step of homogenization of the crystalline structure of the part is implemented after the demoulding step, the homogenization of the crystalline structure of the part is implemented by a heat treatment of the part at a temperature $T_3$ comprised between 800° C. and 1000° C., a tensile stress being applied to the part during the heat treatment at temperature $T_3$ so as to cause plastic deformation of the part, the tensile stress is applied so that the deformation rate is less than $10^{-3}$ $s^{-1}$ at any point of the part, the application of the tensile stress is oriented in a tensile direction, and is removed as soon as the length of the part in the tensile direction is greater than 1.008 times the initial length of the part in the tensile direction, the first tempering is implemented at a fourth temperature $T_4$ comprised between 1000° C. and 1200° C. for at least 3 hours, and the second tempering is implemented at a fifth temperature $T_5$ comprised between 800° C. and 900° C. for at least 10 hours.

DESCRIPTION OF THE FIGURES

Other characteristics, objectives and advantages of the invention will appear from the following description, which is purely illustrative and non-limiting and should be read with regard to the attached drawings, in which:

FIG. 1 illustrates a manufacturing method for the nickel-based superalloy AM1 of the prior art, FIG. 2 illustrates a manufacturing method for the nickel-based superalloy AM1 of the prior art, FIG. 3 is a photomicrograph of a section of the superalloy according to the prior art, FIG. 4 is a photomicrograph of a section of the superalloy of the prior art, the scale bar corresponding to a length of 100 μm, FIG. 5 illustrates a manufacturing method for the nickel-based superalloy AM1 according to one embodiment of the invention wherein homogenization of the crystalline structure of the part is implemented by a heat treatment of the part at a second temperature $T_2$ greater than the solvus temperature of the γ' phase and strictly less than the first temperature $T_1$, the scale bar corresponding to a length of 10 μm, FIG. 6 illustrates a manufacturing method for the nickel-based superalloy AM1 according to one embodiment of the invention wherein the homogenization of the crystalline structure of the part is implemented by a heat treatment of the part at a temperature $T_3$ comprised between 800° C. and 1000° C., a tensile stress being applied to the part during the heat treatment at temperature $T_3$ so as to cause plastic deformation of the part, FIG. 7 is a photomicrograph of a section of the superalloy according to one embodiment of the invention, the scale bar corresponding to a length of 1 μm, FIG. 8 is a photomicrograph of a section of the superalloy according to one embodiment of the invention, the scale bar corresponding to a length of 100 μm, FIG. 9 is a photomicrograph of a section of the superalloy according to one embodiment of the invention, the scale bar corresponding to a length of 10 μm, FIG. 10 illustrates the creep of the parts according to different embodiments of the invention.

Throughout the figures, similar elements bear identical references.

DEFINITIONS

"Superalloy" means an alloy exhibiting very good resistance to oxidation, corrosion, creep and cyclic stresses (especially mechanical or thermal stresses) at high temperature and high pressure.

A superalloy can have a biphasic microstructure comprising a first phase (called "γ phase") forming a matrix and a second phase (called "γ' phase") forming precipitates hardening in the matrix. The coexistence of these two phases is designated by γ-γ' phase.

The "base" of the superalloy designates the main metal component of the matrix. In most cases, superalloys comprise a cobalt or nickel base. The superalloy base is preferentially a nickel base.

"Nickel-based superalloys" have the advantage of offering a good compromise between resistance to oxidation and resistance to breakage at high temperature and weight, which justifies their use in the hottest parts of turbojets.

Nickel-based superalloys are made up of a γ phase (or matrix) of the face-centered γ-Ni cubic austenitic type, optionally containing α-substitution additives in solid solution (Co, Cr, W, Mo, Re), and a γ' phase (or precipitates) of the γ'-Ni₃X type, with X=Al, Ti or Ta. The γ' phase has an L12 ordered structure, derived from the face-centered cubic structure, consistent with the matrix, i.e., having an atomic lattice very close to the latter.

By its ordered nature, the γ' phase has the remarkable property of having mechanical resistance that increases with temperature up to approximately 800° C. The very strong consistency between the γ and γ' phases gives a very high hot mechanical strength for nickel-based superalloys, which itself depends on the γ/γ' ratio and on the size of the hardening precipitates.

The term "mass fraction" designates the ratio of the mass of an element or a group of elements to the total mass.

DETAILED DESCRIPTION OF THE INVENTION

The aircraft part comprises a monocrystalline nickel-based superalloy substrate. The superalloy chosen can be predominantly composed of nickel and preferentially have a mass fraction of chromium comprised between 7% and 9%, of cobalt comprised between 5.5% and 7.5%, of aluminium comprised between 4% and 6%, of titanium comprised between 1% and 2%, of tantalum comprised between 7% and 9%, of molybdenum comprised between 1% and 3% and of tungsten comprised between 4.5% and 6.5%, the superalloy also comprising carbon and zirconium, Especially, the superalloy called "AM1" (registered trademark) can be chosen.

Other nickel-based superalloys can also be used for the manufacture of the substrate, especially the superalloy called "CMSX-4Plus" (registered trademark). The superalloy can be predominantly composed of nickel and preferentially has a mass fraction of chromium comprised between 2.5% and 4.5%, of cobalt comprised between 9% and 11%, of aluminium comprised between 4.5% and 6.5%, of titanium comprised between 0.5% and 1%, of tantalum comprised between 7% and 9%, of molybdenum comprised between 0.3% and 1%, of tungsten comprised between 5% and 7%, and of rhenium comprised between 4% and 5.5%.

In reference to FIG. 5, a method for manufacturing a part according to one embodiment of the invention comprises a step of moulding the part at a temperature greater than the melting temperature of the superalloy.

The method comprises, after the moulding step, a solution heat treatment S1 of the part. The part is put into solution at a first temperature $T_1$. Temperature $T_1$ is comprised between the solvus temperature of the $\gamma'$ phase and the melting temperature of the superalloy. Solution heat treatment makes it possible to diffuse the elements of the superalloy in the substrate of the part. The concentration of the different elements in the substrate is therefore homogenized.

The part is then cooled to room temperature at a controlled speed.

The part can then be demoulded. For example, it is possible to break the mould using vibration. Demoulding can lead to a high local concentration of stresses on the part, these stresses leading to a plastic deformation D1.

The part can undergo plastic deformation D1 by other means, such as assembling the part to another part or handling or moving the part. In particular, the plastic deformation D1 can be unintentional.

A step of homogenization S2 of the crystalline structure of the part is implemented following the plastic deformation(s) undergone by the part. In reference to FIG. 5, the homogenization S2 can be implemented by a heat treatment of the part at a second temperature $T_2$ greater than the solvus temperature of the $\gamma'$ phase and strictly less than the first temperature $T_1$. Thus, the $\gamma'$ phase, during the homogenization S2, can be dissolved in the matrix in the $\gamma$ phase, leading to annihilation of the dislocations caused by plastic deformation. Thus, the local stresses internal to the substrate can be reduced.

Indeed, the temperature corresponding to the solvus of the superalloy decreases after the solution heat treatment S1. Thus, the upper bound of the second temperature $T_2$ allows preventing recrystallization of the substrate during the homogenization S2. Moreover, the temperature is sufficiently high to decrease the internal stresses caused by plastic deformation effectively. Thus, the lower bound of the temperature $T_2$ allows preventing recrystallization of the substrate during one or more later tempering treatments and during the homogenization S2.

The second temperature $T_2$ is preferentially strictly comprised between 1280° C. and 1350° C., especially between 1280° C. and 1300° C., and preferentially between 1285° C. and 1295° C. Especially, when the nickel-based superalloy used for the manufacture of substrate is "CMSX-4Plus", the second temperature $T_2$ can be comprised between 1330° C. and 1335° C.

The homogenization S2 is implemented by the heat treatment of the part at a second temperature $T_2$ for at least 10 minutes, especially for 20 minutes, and preferentially for one hour.

Thus, the treatment time for the homogenization S2 is adapted to the reaction kinetics of the homogenization S2 in the substrate of the part.

In reference to FIG. 6, the homogenization S2 of the crystalline structure of the part can be implemented by a heat treatment of the part at a third temperature $T_3$ comprised between 800° C. and 1000° C., a tensile stress being applied to the part during the heat treatment at the third temperature $T_3$ so as to cause plastic deformation of the part. In this case, the plastic deformation is intentional. The combined effect of the heat treatment implemented at the third temperature and the tensile stress makes it possible to produce homogeneous dislocations at the interfaces of the $\gamma$ matrix and the $\gamma'$ precipitates. Thus, the effect of the plastic deformation in the microstructure is no longer visible after the homogenization S2.

In reference to FIG. 7, the homogenization S2 makes it possible to eliminate the trace of localized stresses in the substrate. The microstructure of the superalloy directly after the homogenization S2 has cuboid $\gamma'$ precipitates.

After the homogenization S2, the part is cooled to room temperature.

A first tempering R1 at a fourth temperature $T_4$ comprised between 1000° C. and 1200° C. for at least 3 hours, and a second tempering R2 at a fifth temperature $T_5$ comprised between 800° C. and 900° C. for at least 10 hours are then implemented. These treatments make it possible to optimize the size, morphology and distribution of $\gamma'$ precipitates, as well as the volume fraction thereof.

The tensile stress is preferentially applied to the part so that the deformation rate is less than $10^{-3}$ s$^{-1}$ at any point of the part.

Thus, it is possible to prevent the appearance of slip bands in the microstructure of the substrate.

In reference to FIG. 8 and FIG. 9, when the homogenization S2 comprises a heat treatment of the part at a third temperature $T_3$ comprised between 800° C. and 1000° C. and a tensile stress, the shape of the $\gamma'$ precipitates after the tempering treatments is different from the known cuboid form of the superalloy AM1.

FIG. 10 illustrates a creep test. Curve (a) is a measurement of the elongation of a known part that has not undergone plastic deformation. Curve (b) is a measurement of the elongation of a known part that has undergone plastic deformation. Curve (c) is a measurement of the elongation of a part manufactured by a method according to one embodiment of the invention, the method comprising a step of homogenization S2 of the crystalline structure of the part implemented by a heat treatment of the part at a second temperature $T_2$ greater than the solvus temperature of the $\gamma'$ phase and strictly less than the first temperature $T_1$. Curve (d) is a measurement of the elongation of a part manufactured by a method according to the invention, the method comprising a step of homogenization S2 of the crystalline structure implemented by a heat treatment of the part at a third temperature $T_3$ comprised between 800° C. and 1000° C., a tensile stress being applied to the part during the heat treatment at temperature $T_3$ so as to cause plastic deformation of the part. The plastic deformation of the part corresponding to curve (b) reduces the service life of the part due to recrystallization during creep. The creep duration of the part corresponding to curve (c) is greater than that of the part corresponding to model (a). The creep duration of the part corresponding to curve (d) is 85% of that of the part corresponding to model (a).

The invention claimed is:

1. Manufacturing method for an aircraft part, the part comprising a monocrystalline nickel-based superalloy substrate, the method successively implementing the following steps:
   moulding the part at a moulding temperature greater than the melting temperature of the superalloy and cooling the part, so that the monocrystalline superalloy has a γ phase and a γ' phase,
   solution heat treatment of the part at a first temperature $T_1$ comprised between the solvus temperature of the γ' phase and the melting temperature of the superalloy,
   cooling the part,
   homogenization of a crystalline structure of the aircraft part,
   cooling the part,
   first tempering and second tempering.

2. Method according to claim 1, wherein the superalloy is predominantly composed of nickel and has a mass fraction of chromium comprised between 7% and 9%, of cobalt comprised between 5.5% and 7.5%, of aluminium comprised between 4% and 6%, of titanium comprised between 1% and 2%, of tantalum comprised between 7% and 9%, of molybdenum comprised between 1% and 3% and of tungsten comprised between 4.5% and 6.5%, the superalloy also comprising carbon and zirconium.

3. Method according to claim 1, wherein the superalloy is predominantly composed of nickel and preferentially has a mass fraction of chromium comprised between 2.5% and 4.5%, of cobalt comprised between 9% and 11%, of aluminium comprised between 4.5% and 6.5%, of titanium comprised between 0.5% and 1%, of tantalum comprised between 7% and 9%, of molybdenum comprised between 0.3% and 1%, of tungsten comprised between 5% and 7%, and of rhenium comprised between 4% and 5.5%.

4. Method according to claim 1, wherein the moulding step is followed by a demoulding step, and wherein the step of homogenization of the crystalline structure of the aircraft part is implemented after the demoulding step.

5. Method according to claim 1, wherein the homogenization of the crystalline structure of the part is implemented by a heat treatment of the aircraft part at a second temperature $T_2$ greater than the solvus temperature of the γ' phase and strictly less than the first temperature $T_1$.

6. Method according to claim 5, wherein the second temperature $T_2$ is strictly comprised between 1280° C. and 1350° C.

7. Method according to claim 5, wherein the homogenization is implemented by the heat treatment of the aircraft part at a second temperature $T_2$ for at least 10 minutes.

8. Method according to claim 7, wherein the second temperature $T_2$ is strictly comprised between 1280° C. and 1350° C.

9. Method according to claim 7, wherein the homogenization is implemented by the heat treatment of the aircraft part at a second temperature $T_2$ for 20 minutes.

10. Method according to claim 7, wherein the homogenization is implemented by the heat treatment of the aircraft part at a second temperature $T_2$ for one hour.

11. Method according to claim 1, wherein the homogenization of the crystalline structure of the part is implemented by a heat treatment of the aircraft part at a third temperature $T_3$ comprised between 800° C. and 1000° C., a tensile stress being applied to the part during the heat treatment at temperature $T_3$ so as to cause plastic deformation of the part.

12. Method according to claim 11, wherein the tensile stress is applied so that the deformation rate is less than $10^{-3}$ $s^{-1}$ at any point of the part.

13. Method according to claim 11, wherein the application of the tensile stress is oriented in a tensile direction, and is removed as soon as the length of the part in the tensile direction is greater than 1.008 times the initial length of the part in the tensile direction.

14. Method according to claim 1, wherein the first tempering is implemented at a fourth temperature $T_4$ comprised between 1000° C. and 1200° C. for at least 3 hours, and the second tempering is implemented at a fifth temperature $T_5$ comprised between 800° C. and 900° C. for at least 10 hours.

* * * * *